(12) United States Patent
Schubert

(10) Patent No.: US 8,664,684 B2
(45) Date of Patent: Mar. 4, 2014

(54) SOLID STATE LIGHTING DEVICES WITH IMPROVED CONTACTS AND ASSOCIATED METHODS OF MANUFACTURING

(75) Inventor: Martin F. Schubert, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 334 days.

(21) Appl. No.: 12/872,092

(22) Filed: Aug. 31, 2010

(65) Prior Publication Data

US 2012/0049756 A1    Mar. 1, 2012

(51) Int. Cl.
*H01L 33/38* (2010.01)

(52) U.S. Cl.
USPC .......... 257/99; 257/13; 257/E33.066

(58) Field of Classification Search
None
See application file for complete search history.

(56) References Cited

U.S. PATENT DOCUMENTS

| | | | |
|---|---|---|---|
| 6,512,248 B1 | 1/2003 | Takeuchi et al. | |
| 6,933,169 B2 | 8/2005 | Shibata et al. | |
| 7,105,861 B2 | 9/2006 | Erchak et al. | |
| 7,598,531 B2 | 10/2009 | Erchak et al. | |
| 2003/0111667 A1* | 6/2003 | Schubert | 257/98 |
| 2008/0135867 A1 | 6/2008 | Feng et al. | |
| 2009/0026468 A1* | 1/2009 | Sakai et al. | 257/88 |
| 2009/0039374 A1* | 2/2009 | Yahata et al. | 257/98 |

FOREIGN PATENT DOCUMENTS

WO  PCT/JP2007/053306    *  9/2007

* cited by examiner

*Primary Examiner* — Fei Fei Yeung Lopez
(74) *Attorney, Agent, or Firm* — Perkins Coie LLP

(57) ABSTRACT

Solid state lighting ("SSL") devices with improved contacts and associated methods of manufacturing are disclosed herein. In one embodiment, an SSL device includes an SSL structure having a first semiconductor material, a second semiconductor material spaced apart from the first semiconductor material, and an active region between the first and second semiconductor materials. The SSL device also includes a first contact on the first semiconductor material and a second contact on the second semiconductor material, where the first and second contacts define the current flow path through the SSL structure. The first or second contact is configured to provide a current density profile in the SSL structure based on a target current density profile.

4 Claims, 9 Drawing Sheets

SOLID STATE LIGHTING DEVICES WITH IMPROVED CONTACTS AND ASSOCIATED METHODS OF MANUFACTURING

TECHNICAL FIELD

The present disclosure is related to solid state lighting ("SSL") devices with improved contacts and associated methods of manufacturing.

BACKGROUND

Mobile phones, personal digital assistants ("PDAs"), digital cameras, MP3 players, and other portable electronic devices utilize SSL devices (e.g., light emitting diodes (LEDs)) for background illumination. SSL devices are also used for signage, indoor lighting, outdoor lighting, and other types of general illumination. FIGS. 1A and 1B are cross-sectional and plan views of a conventional SSL device 10 with lateral contacts, respectively. As shown in FIG. 1A, the SSL device 10 includes a substrate 12 carrying an LED structure 11 having N-type gallium nitride (GaN) 14, GaN/indium gallium nitride (InGaN) multiple quantum wells ("MQWs") 16, and P-type GaN 18. Referring to FIGS. 1A and 1B, the SSL device 10 also includes a first contact 20 on the N-type GaN 14 and a second contact 22 (shown with a transparent current spreading material 29) on the P-type GaN 18. The first and second contacts 20 and 22 also include first and second contact fingers 20a, 20b, 22a, and 22b (FIG. 1B), respectively. FIGS. 2A and 2B are cross-sectional and plan views of another conventional SSL device 10' with vertical contacts, respectively. The first contact 20 includes a plurality of conductive fingers 21 (three are shown for illustration purposes) coupled to one another by a cross member 23. The second contact 22 includes a reflective and conductive material (e.g., aluminum).

In operation, a continuous or pulsed electrical voltage is applied between the first and second contacts 20 and 22. In response, an electrical current flows from the first contact 20, through the P-type GaN 18, the GaN/InGaN MQWs 16, and the N-type GaN 14, to the second contact 22. The GaN/InGaN MQWs 16 then convert a portion of the electrical energy into light. The generated light is emitted from the SSL devices 10 and 10' for illumination, signage, and/or other suitable purposes.

It is believed that SSL devices can operate at peak efficiencies when current densities are at or near a threshold level in the SSL devices. However, as discussed in more detail later, the current densities through different regions of the GaN/InGaN MQWs 16 in the SSL devices 10 and 10' can be spatially non-uniform. For example, as shown in FIG. 1B, certain regions (e.g., regions II and III) of the GaN/InGaN MQWs 16 of the SSL device 10 may operate at lower current densities than other regions (e.g., region I) of the GaN/InGaN MQWs 16. In another example, the SSL device 10' can have varying current densities based on the location of the conductive fingers 21. Such spatially varying current densities can reduce the overall operating efficiency of the SSL devices 10 and 10'. Accordingly, several improvements to balance regional current densities in SSL devices may be desirable.

DETAILED DESCRIPTION

Various embodiments of SSL devices with improved contacts and associated methods of manufacturing are described below. As used hereinafter, the term "SSL device" generally refers to devices with LEDs, organic light emitting diodes ("OLEDs"), laser diodes ("LDs"), polymer light emitting diodes ("PLEDs"), and/or other suitable radiation devices other than electrical filaments, a plasma, or a gas. A person skilled in the relevant art will also understand that the technology may have additional embodiments and may be practiced without several of the details of the embodiments described below with reference to FIGS. 3A-8B.

Figure 3A:
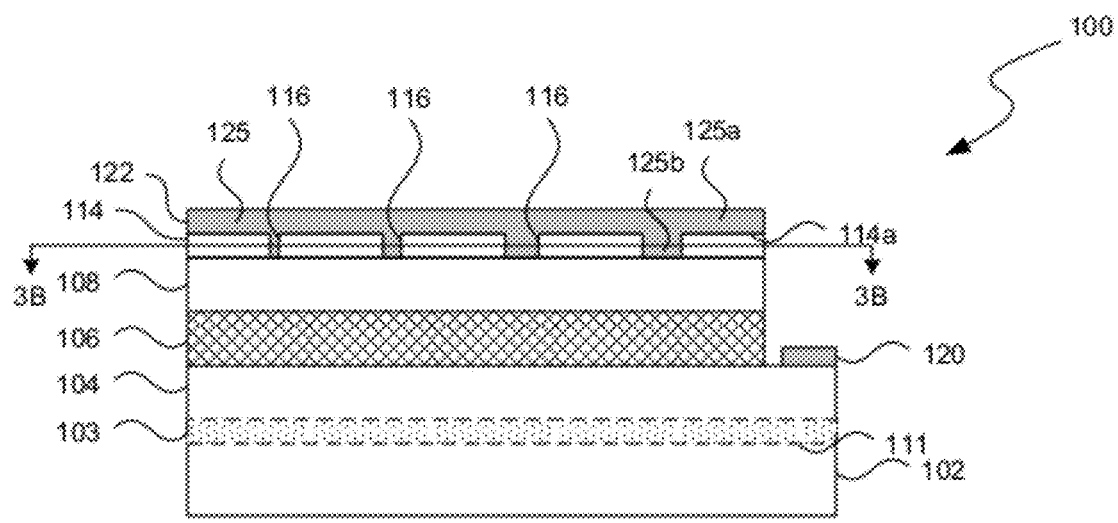
FIG. 3A is a cross-sectional view of a SSL device in accordance with embodiments of the technology.

FIG. 3A is a schematic cross-sectional diagram of an SSL device 100 in accordance with embodiments of the technology. As shown in FIG. 3A, the SSL device 100 can include a substrate material 102, an optional buffer material 103, a first semiconductor material 104, an active region 106, and a second semiconductor material 108. The SSL device 100 also can also include a first contact 120 on the first semiconductor material 104 and a second contact 122 on the second semiconductor material 108. In the illustrated embodiment, the first and second contacts 120 and 122 are arranged laterally relative to each other. In other embodiments, the first and second contacts 120 and 122 can also be arranged vertically relative to each other or in some other suitable contact configuration, as discussed in more detail below with reference to FIGS. 4A-7B. In any of these embodiments, the SSL device may optionally include a reflective material (e.g., a silver film), a carrier material (e.g., a ceramic substrate), an optical component (e.g., a collimator), and/or other suitable components.

In certain embodiments, the substrate material 102 can include silicon (Si), at least a portion of which has the Si(1,1,1) crystal orientation. In other embodiments, the substrate material 102 can include silicon with other crystal orientations (e.g., Si(1,0,0)), AlGaN, GaN, silicon carbide (SiC), sapphire ($Al_2O_3$), zinc oxide ($ZnO_2$), a combination of the foregoing materials and/or other suitable substrate materials. In the illustrated embodiment, the substrate material 102 has a generally planar surface 111 proximate to the optional buffer material 103. In other embodiments, the substrate material 102 may also include a non-planar surface (e.g., having openings, channels, and/or other surface features, not shown).

The optional buffer material 103 can facilitate the formation of the first and second semiconductor materials 104 and 108 and the active region 106 on the substrate material 102. In certain embodiments, the optional buffer material 103 can include at least one of aluminum nitride (AlN), aluminum-gallium nitride (AlGaN), zinc nitride (ZnN), GaN, and/or other suitable materials. In other embodiments, the optional buffer material 103 may be omitted, and the first semiconductor material 104 may be formed directly on the substrate material 102.

In certain embodiments, the first semiconductor material 104 can include N-type GaN (e.g., doped with silicon (Si)), and the second semiconductor material 108 can include P-type GaN (e.g., doped with magnesium (Mg)). In other embodiments, the first semiconductor material 104 can include P-type GaN, and the second semiconductor material 108 can include N-type GaN. In further embodiments, the first and second semiconductor materials 104 and 108 can individually include at least one of gallium arsenide (GaAs), aluminum gallium arsenide (AlGaAs), gallium arsenide phosphide (GaAsP), gallium (III) phosphide (GaP), zinc selenide (ZnSe), boron nitride (BN), AlGaN, and/or other suitable semiconductor materials.

The active region 106 can include a single quantum well ("SQW"), MQWs, and/or a bulk semiconductor material. As used hereinafter, a "bulk semiconductor material" generally refers to a single grain semiconductor material (e.g., InGaN) with a thickness greater than about 10 nanometers and up to about 500 nanometers. In certain embodiments, the active region 106 can include an InGaN SQW, GaN/InGaN MQWs, and/or an InGaN bulk material. In other embodiments, the active region 106 can include aluminum gallium indium phosphide (AlGaInP), aluminum gallium indium nitride (AlGaInN), and/or other suitable materials or configurations.

In certain embodiments, the first semiconductor material 104, the active region 106, the second semiconductor material 108, and the optional buffer material 103 can be formed on the substrate material 102 via metal organic chemical vapor deposition ("MOCVD"), molecular beam epitaxy ("MBE"), liquid phase epitaxy ("LPE"), and/or hydride vapor phase epitaxy ("HVPE"). In other embodiments, at least one of the foregoing components may be formed via other suitable epitaxial growth techniques.

Figure 3B:
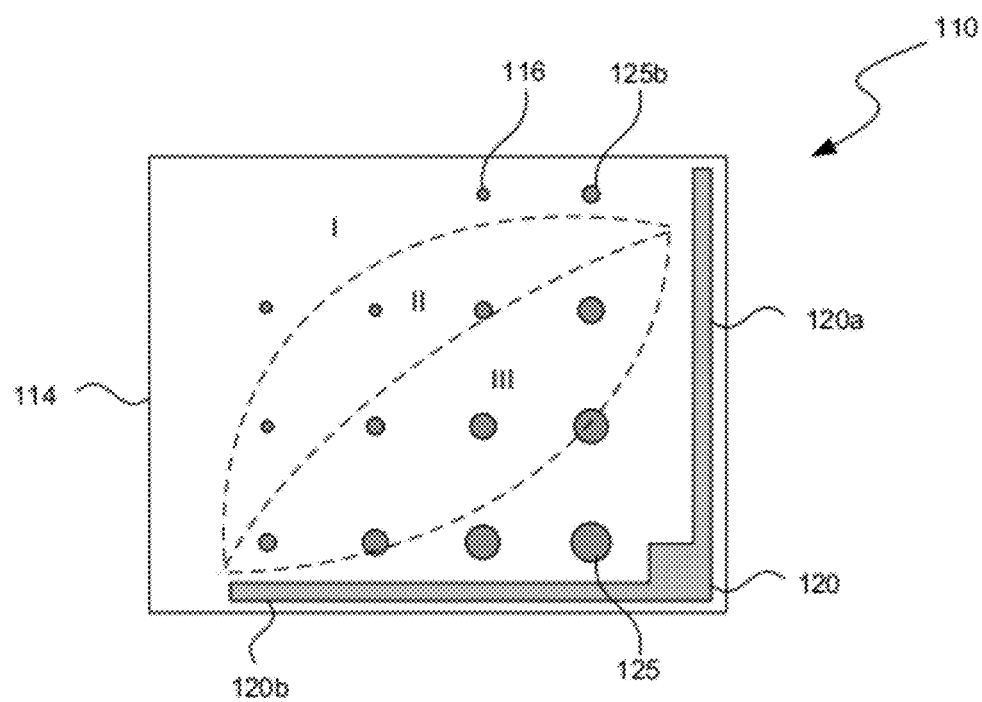
FIGS. 3B-3D are plan views of a portion of the SSL device in FIG. 3A in accordance with embodiments of the technology.

As shown in FIG. 3B, the first contact 120 can include first lateral and first transverse contact fingers 120a and 120b extending along the X- and Y-axes, respectively. The first contact 120 can include copper (Cu), aluminum (Al), silver (Ag), gold (Au), platinum (Pt), and/or other suitable conductive materials. Techniques for forming the first contact 120 can include MOCVD, MBE, spray pyrolysis, pulsed laser deposition, sputtering, electroplating, and/or other suitable deposition techniques. In other embodiments, the first contact 120 can include other suitable configurations.

Referring back to FIG. 3A, the second contact 122 can include an insulative material 114 and a conductive material 125 that is on and/or through at least a portion of the insulative material 114. The insulative material 114 can include one or more openings 116 (e.g., vias) extending between the second semiconductor material 108 and a top surface 114a of the insulative material 114. Four openings 116 are shown in FIG. 3A for illustration purposes, though in other embodiments, the insulative material 114 can include one, two, three, five, or any other desired number of openings 116. In certain embodiments, the insulative material 114 can include silicon dioxide (SiO2), silicon nitride (SiN), and/or other dielectric materials. In other embodiments, the insulative material 114 can include doped or un-doped silicon (Si), germanium (Ge), gallium arsenide (GaAs), and silicon carbide (SiC), and/or other suitable semiconductor materials. In further embodiments, the insulative material 114 can include a combination of the foregoing dielectric and semiconductor materials.

The conductive material 125 can include a first portion 125a on the top surface 114a of the insulative material 114 and a second portion 125b in the openings 116 of the insulative material 114. The second portion 125b and the corresponding openings 116 are referred to herein after as "contact portions." In certain embodiments, the first and second portions 125a and 125b of the conductive material 125 can be the same material. For example, both the first and second portions 125a and 125b can include indium tin oxide ("ITO"). In other embodiments, the first and second portions 125a and 125b can include different transparent and conductive materials. For example, the first portion 125a can include ITO, and the second portion 125b can include aluminum zinc oxide ("AZO"), fluorine-doped tin oxide ("FTO"), and/or other suitable transparent and conductive oxide ("TCOs"). In further embodiments, the first portion 125a can include at least one of ITO, AZO, FTO, and/or other suitable TCOs, and the second portion 125b can include copper (Cu), aluminum (Al), silver (Ag), gold (Au), platinum (Pt), and/or other suitable conductive but non-transparent materials.

Figure 3C:
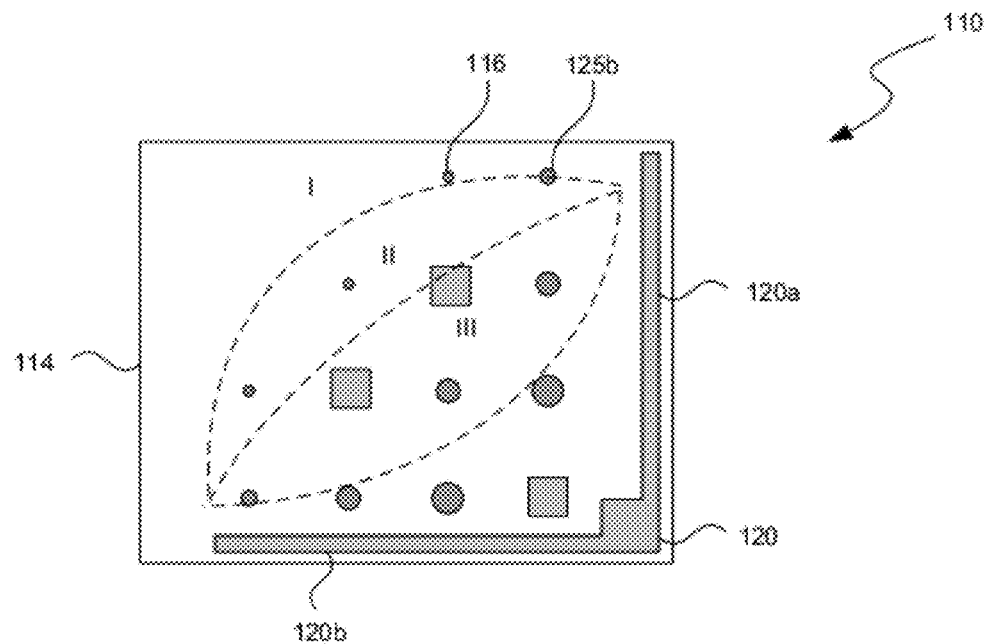
Figure 3D:
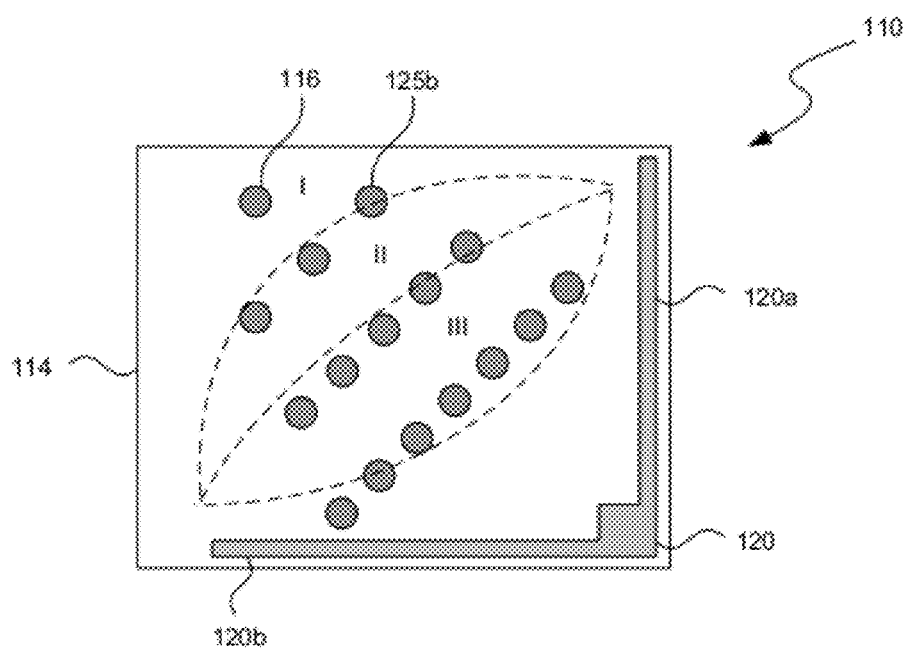

The contact portions can be configured to spatially control local current densities flowing through the regions of the SSL device 100. Without being bound by theory, it is believed that the cross-sectional area and/or other characteristics of the individual contact portions may be proportional to or at least influence a contact resistance formed between the contact portions and the second semiconductor material 108. As used herein, the term "contact resistance" generally refers to an electrical resistance as a result of two materials in direct contact with each other and forming an interface therebetween. As a result, in certain embodiments, at least one of a shape, size, geometric profile, configuration, and/or other characteristics of the individual contact portions can be adjusted to influence the contact resistance based on a target regional current density in the SSL device 100. For example, as shown in FIG. 3B, the individual contact portions can have different diameters in different regions of the SSL device 100. As shown in FIG. 3C, the individual contact portions can have different cross-sectional shapes in different regions of the SSL device 100. In other embodiments, the contact portions may have generally similar or different sizes and/or shapes, the number of contact portions in different regions of the SSL device 100 may be adjusted based on a target regional current density, as shown in FIG. 3D. In further embodiments, the insulative material 114 may include a plurality of isolated "islands" (not shown) spaced apart by corresponding contact portions.

Figure 1A:
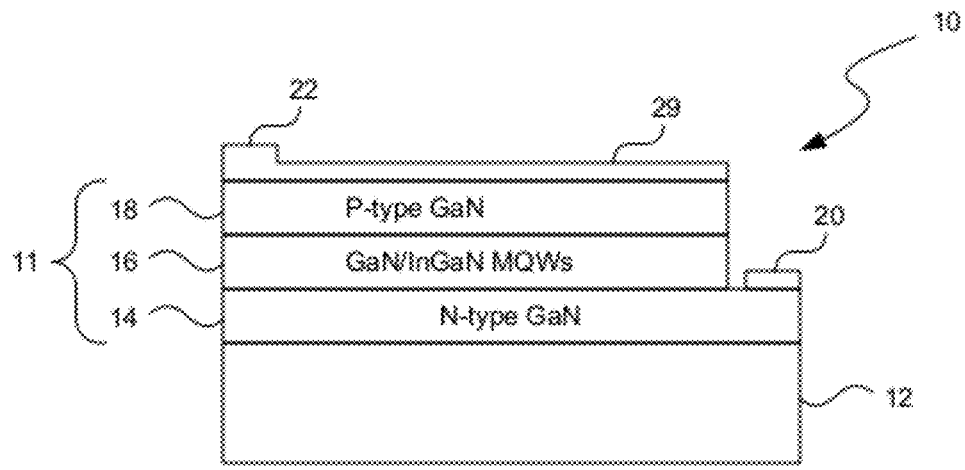
FIG. 1A is a schematic cross-sectional diagram of an SSL device in accordance with the prior art.
Figure 1B:
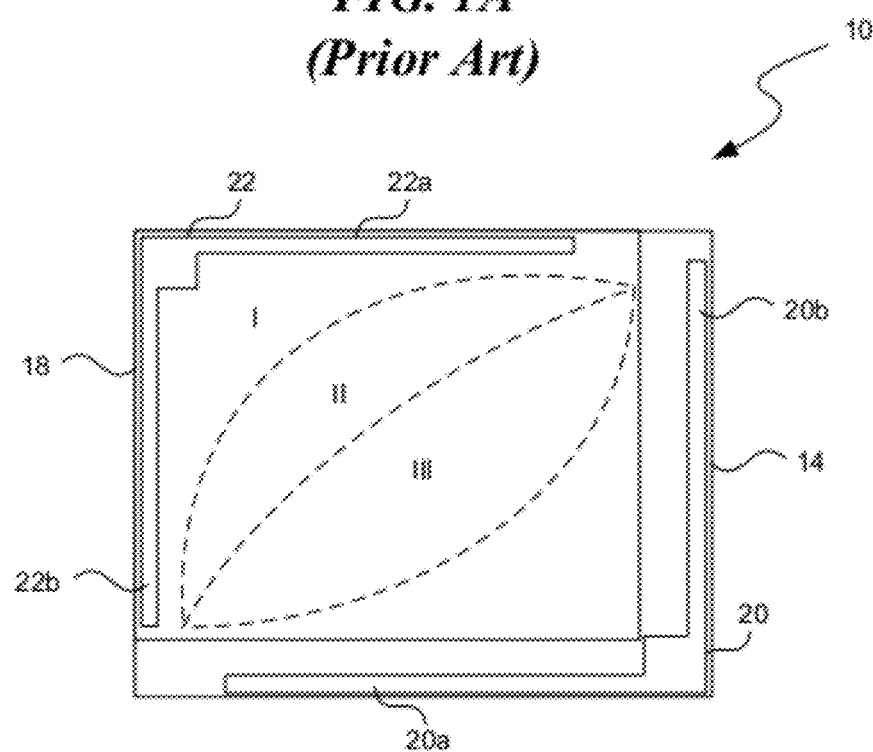
FIG. 1B is a schematic plan view of the SSL device in FIG. 1A.

Several embodiments of the SSL device 100 can have more balanced current density profiles than conventional devices. For example, referring back to FIG. 1B, it has been observed that regions I, II, and III of the conventional SSL device 10 can have different current densities during operation. In particular, it has been observed that, for example, region I tends to have higher current densities than region II, and region II has higher current densities than region III. Without being bound by theory, it is believed that such current density gradients are a result of varying electrical conductance (or resistance) along different current flow paths in the SSL device 10. For example, locations in region I are closer to the first and second contact fingers 20a and 20b of the first contact 20 than those in regions II and III. As a result, region I has a higher electrical conductance (or lower resistance) than regions II and III, which tends to cause electrical currents to flow through region I more than through regions II and III. In other examples, depending on the conductivity of the first semiconductor material 104 and the current spreader layer 29, the current density gradients discussed above may be reversed.

Referring back to FIGS. 3A-3D, by modulating the contact resistance between the second contact 122 and the second semiconductor material 108, an overall resistance of current flow paths in regions of the SSL device 100 can be manipulated. As a result, the SSL device 100 may have more balanced (e.g., uniform) current density profiles than those shown above in the Background section. For example, as shown in FIGS. 3B-3D, the contact resistance of regions I and II of the SSL device 100 can be increased to be at least approximate or generally equal to that of region III by having smaller sized contact portions, a lower number of contact portions, and/or other suitable characteristics of the contact portions. As a result, during operation, more electrical current can be injected into Regions III such that the current flows generally evenly through regions I, II, and III to achieve a generally uniform current density profile in the SSL device 100.

Figure 4A:
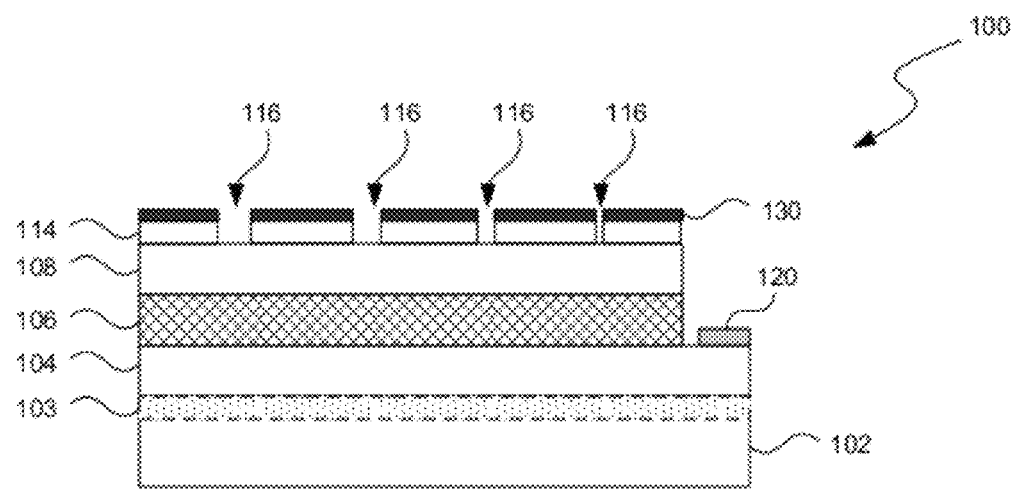
FIGS. 4A-4B are cross-sectional views of a microelectronic substrate undergoing a process for forming the SSL device in FIG. 3A.
Figure 4B:
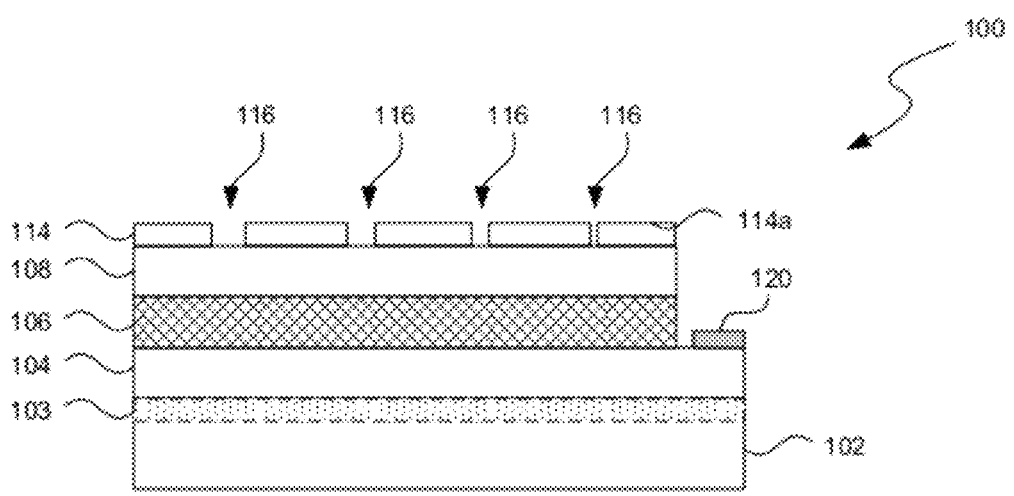

FIGS. 4A and 4B are cross-sectional views of a microelectronic substrate undergoing a process for forming the SSL device 100 in FIG. 3A. As shown in FIG. 4A, an initial stage of the process can include forming the first semiconductor material 104, the active region 106, and the second semiconductor material 108 on the substrate material 102 with the optional buffer material 103. Another stage of the process can include depositing the insulative material 114 onto the second semiconductor material 108. Techniques for depositing the insulative material 114 can include chemical vapor deposition ("CVD"), atomic layer deposition ("ALD"), spin coating, and/or other suitable deposition techniques. A masking material 130 (e.g., a photoresist) can then be formed on the top surface 114a of the insulative material 114 and patterned generally corresponding to the openings 116 (FIG. 3A).

A portion of the insulative material 114 is then removed to form the openings 116. Techniques for removing the insulative material 114 can include dry etching, wet etching, laser ablation, and/or other suitable material removal techniques. After forming the openings 116, the masking material 130 can then be removed via wet etching and/or other suitable techniques, as shown in FIG. 4B. The process can then include depositing the conductive material 125 in the openings 116 and on the top surface 114a of the insulative material 114 to yield the SSL device 100 as shown in FIG. 3A. Techniques for depositing the conductive material 125 can include CVD, ALD, spin coating, and/or other suitable deposition techniques.

Figure 5A:
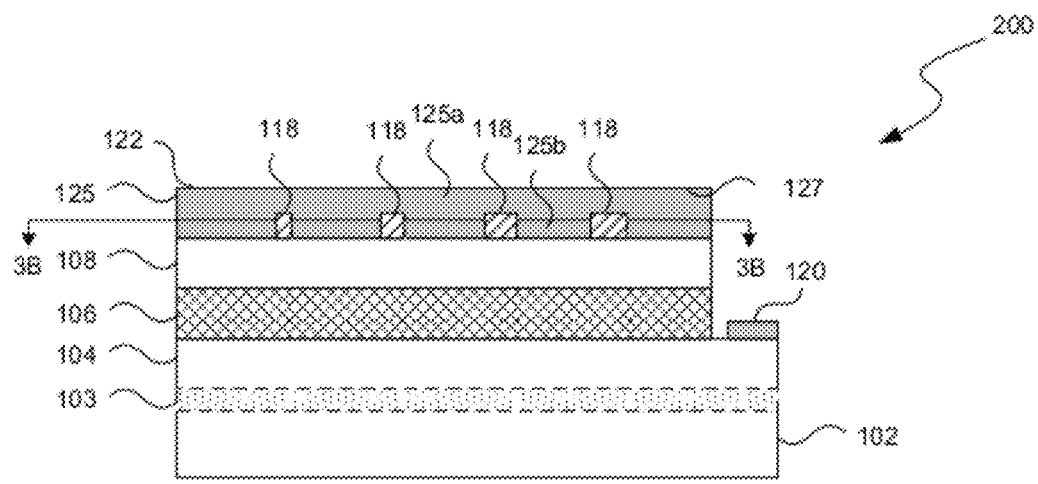
FIG. 5A is a cross-sectional view of another SSL device in accordance with embodiments of the technology.
Figure 5B:
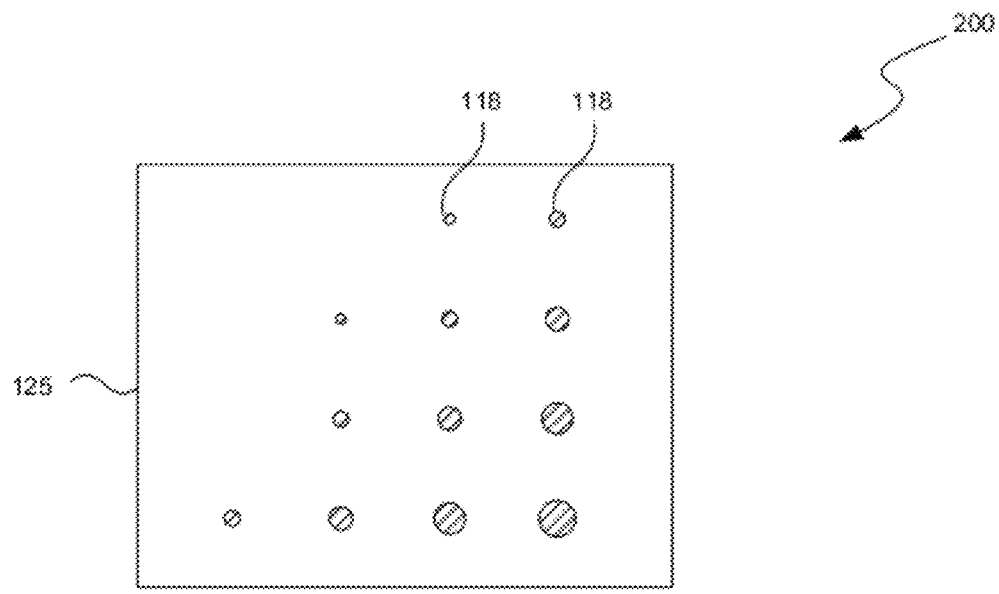
FIG. 5B is a plan view of a portion of the SSL device in FIG. 5A.

Even though the regional electrical resistance of the SSL device 100 is controlled or otherwise modulated by interposing a generally insulative material 114 between the conductive material 125 and the second semiconductor material 108 as shown in FIGS. 3A-3D, in other embodiments, the regional electrical resistance can also be modulated by interposing a contact material between the conductive material 125 and the second semiconductor material 108. FIGS. 5A and 5B are a cross-sectional view and a plan view of an SSL device 200 in accordance with additional embodiments of the technology. As shown in FIG. 5A, the second contact 122 can include the conductive material 125 that encapsulates a plurality of pads of a contact material 118. The conductive material 125 includes a generally continuous first portion 125a and a second portion 125b between adjacent pads of the contact material 118. In the illustrated embodiment, the pads of the contact material 118 extend only partially from the second semiconductor material 108 into the conductive material 125. In other embodiments, the pads of the contact material 118 may extend completely to a conductive surface 127 of the conductive material 125.

The contact material 118 can form an interface with the second semiconductor material 108 with a lower contact resistance than can the conductive material 125. For example, in one embodiment, the conductive material 125 includes at least one of ITO, AZO, FTO, and/or other suitable TCOs, and the contact material 118 can include copper (Cu), aluminum (Al), silver (Ag), gold (Au), platinum (Pt), and/or other suitable metals. Without being bound by theory, it is believed that TCOs tend to have higher contact resistance when formed on a semiconductor material than metals. In another embodiment, the conductive material 125 can include aluminum (Al), and the contact material 118 can include silver (Ag) or gold (Au), which are believed to have lower contact resistance when formed on a semiconductor material than aluminum. In further embodiments, the contact material 118 can form a generally Ohmic contact with the second semiconductor material 108 while the conductive material 125 forms a Schottky contact and/or other suitable types of at least partially resistive contact with the second semiconductor material 108. In yet further embodiments, the conductive material 125 and the contact material 118 can include other suitable compositions and/or configurations.

Similar to the embodiments discussed above with reference to FIGS. 3A-3D, the contact material 118 can be configured to spatially modulate current densities flowing through the specific regions of the SSL device 200. For example, as shown in FIG. 5B, the pads of the contact material 118 can individually have a size different than others in different regions of the SSL device 200. It is believed that having larger pads of the contact material 118 can increase the current density through a particular region of the SSL device 200 over other regions because the contact material 118 has a lower contact resistance than the conductive material 125. As a result, by adjusting at least one of a shape, size, geometric profile, configuration, and/or other characteristics of the individual pads of the contact material 118, a generally uniform current density profile may be achieved in the SSL device 200.

Figure 6A:
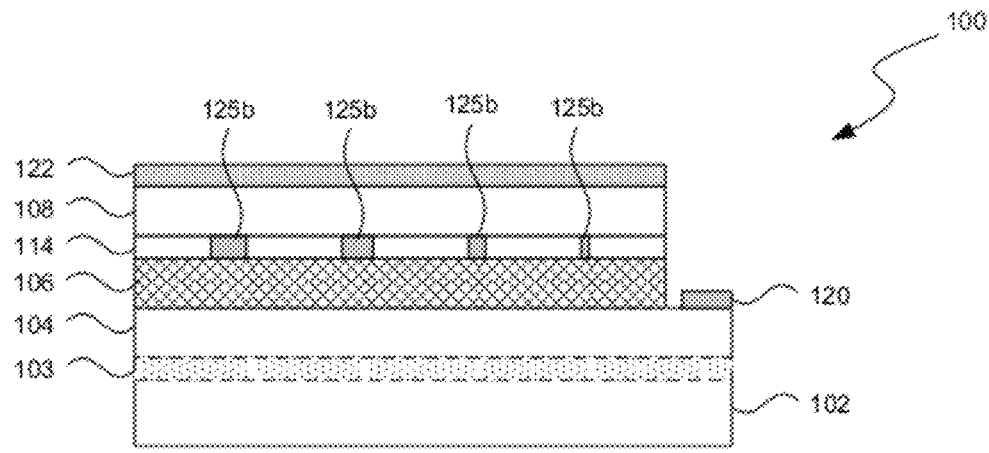
FIGS. 6A-6C are cross-sectional views of another SSL device in accordance with embodiments of the technology.
Figure 6B:
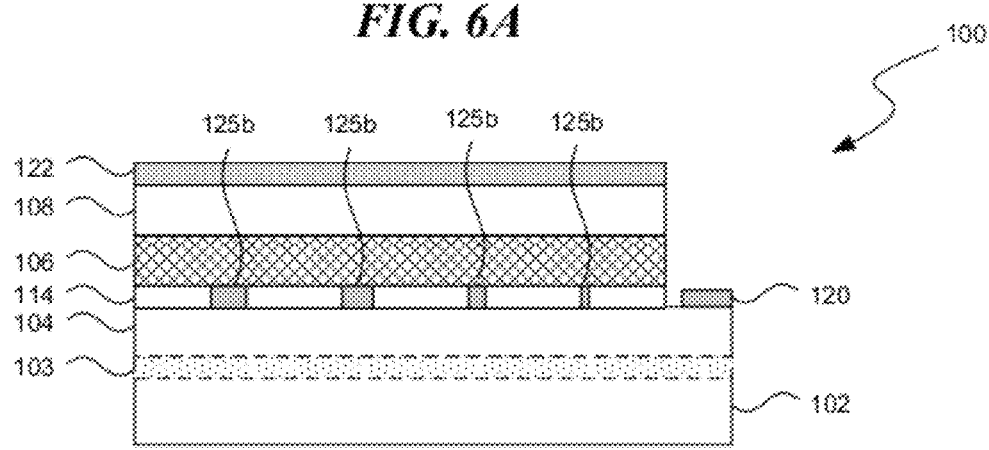
Figure 6C:
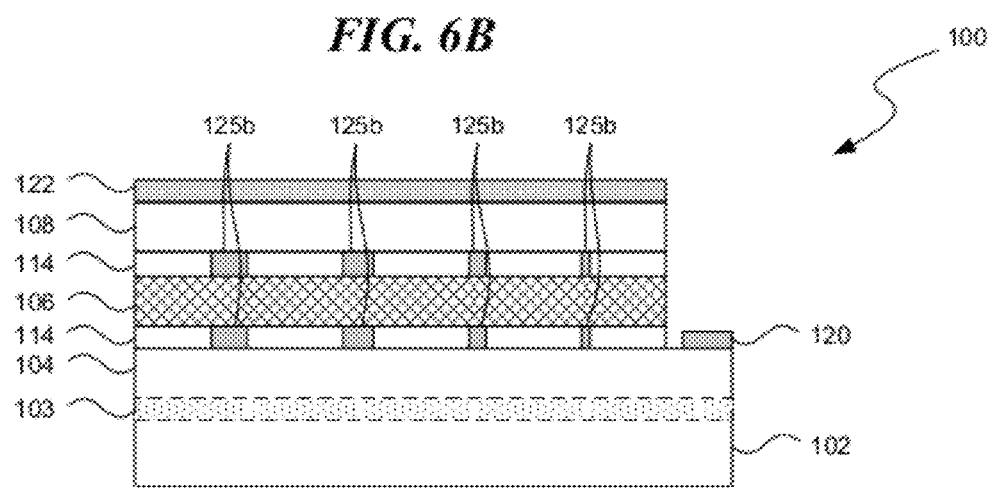

Even though the insulative material 114 and the contact material 118 are discussed above with reference to FIGS. 3A-3D and 5A as being on the second semiconductor material 108, in other embodiments, the insulative material 114 and/or the contact material 118 can also have other structural arrangements. For example, as shown in FIG. 6A, the insulative material 114 and the corresponding second portion 125b of the conductive material 125 can be located between the active region 106 and the first semiconductor material 104. In another example, as shown in FIG. 6B, the insulative material 114 and the corresponding second portion 125b of the conductive material 125 can be located between the active region 106 and the first semiconductor material 104. In a further example, as shown in FIG. 6C, the SSL device 100 may have the insulative material 114 and the corresponding second portion 125b in more than one location. In any of these embodiments, the current density through the active region 106 is controlled by the pattern, size and/or shape of the conductive material 125 in the openings 116 of the insulative material 114 as described above with reference to FIGS. 3A-3D.

Figure 2A:
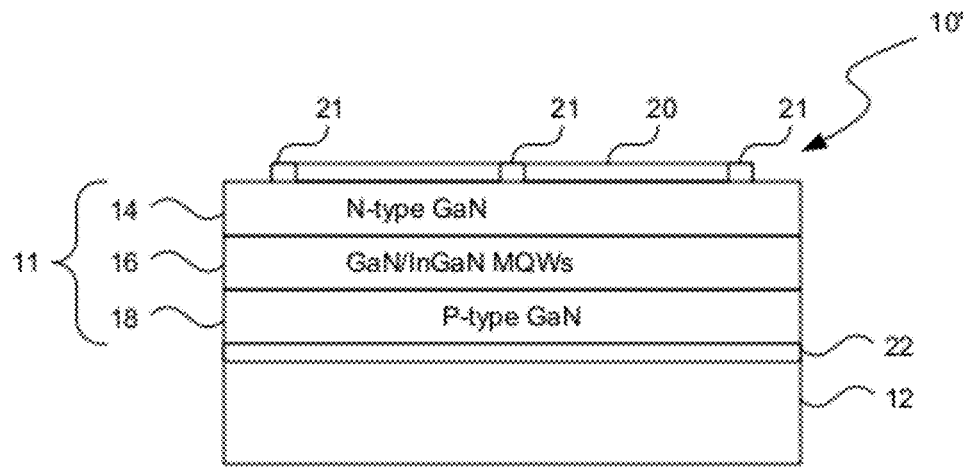
FIG. 2A is a schematic cross-sectional diagram of another SSL device in accordance with the prior art.
Figure 2B:
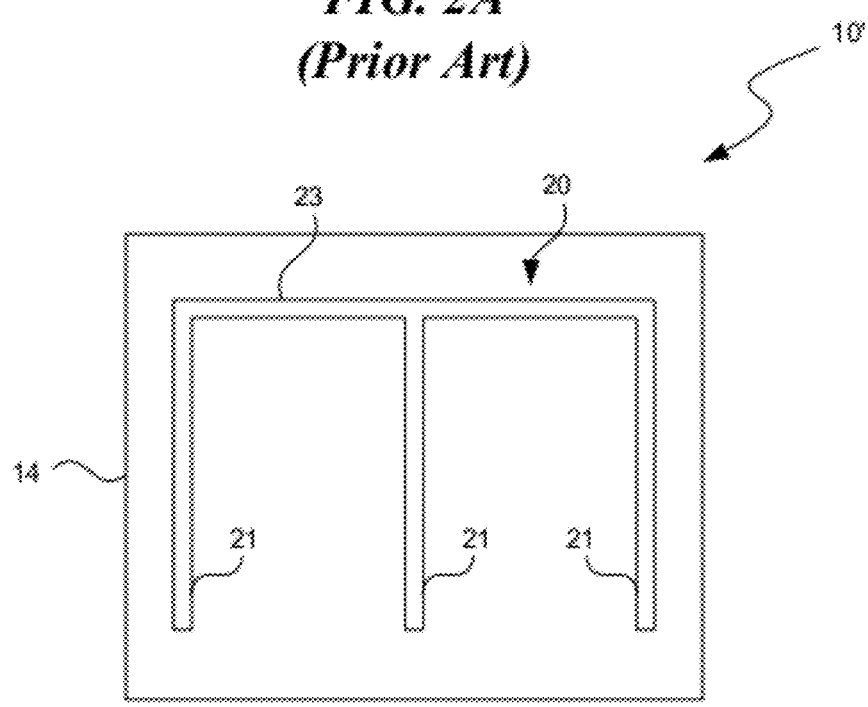
FIG. 2B is a schematic plan view of the SSL device in FIG. 2A.
Figure 7A:
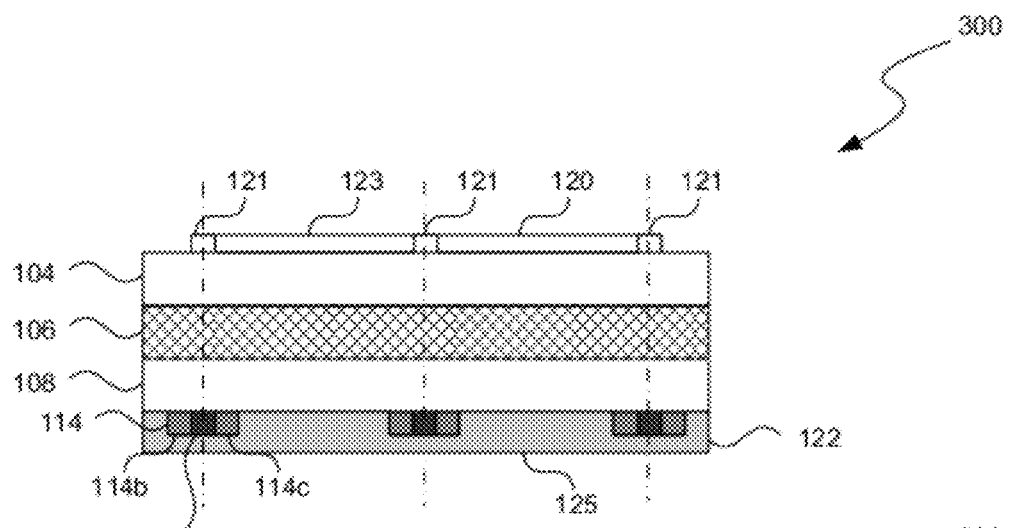
FIGS. 7A-7C are cross-sectional views of yet another SSL device in accordance with embodiments of the technology.
Figure 7B:
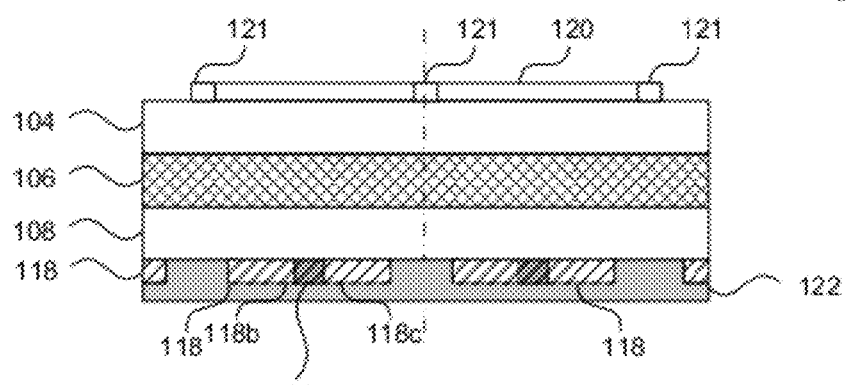
Figure 7C:
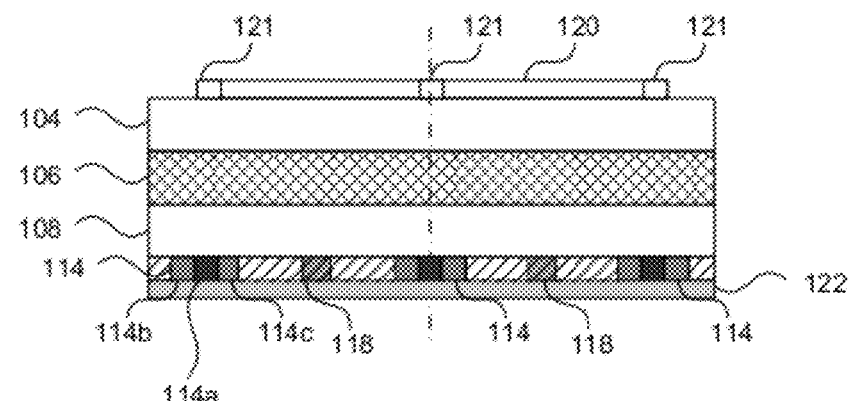

FIGS. 7A-7C are cross-sectional views of an SSL device 300 with vertical contacts in accordance with embodiments of the technology. As shown in FIG. 7A, the SSL device 300 can include a first contact 120 spaced apart from a second contact 122. The first contact 120 can include contact fingers 121 and a cross member 123 generally similar to the contact fingers 21 and cross member 23 discussed above with reference to FIG. 2B.

The second contact 122 can include a conductive material 125 that at least partially encapsulates portions of an insulative material 114; each portion of the insulative material 114 corresponds to one of the contact fingers 121. The insulative portions can have different contact resistance for controlling and/or otherwise modulating a regional current density. For example, as shown in FIG. 7A, the insulative material 114 can include a first insulative portion 114*a* generally aligned with the corresponding contact finger 121. A second insulative portion 114*b* and a third insulative portion 114*c* straddle the first insulative portion 114*a*. In certain embodiments, the first insulative portion 114*a* can have a higher contact resistance than the second and third insulative portions 114*b* and 114*c*, which may have a higher contact resistance than the conductive material 125.

Referring back to FIGS. 2A and 2B, without being bound by theory, it is believed that the areas underneath the contact fingers 21 and the cross member 23 in the SSL device 10' tend to have the highest current densities because these areas provide the shortest paths for the electrical current to flow through. Other areas (e.g., those laterally spaced apart from the contact fingers 21) tend to have lower current densities because these areas provide longer paths for the electrical current to flow through. As a result, by modulating the contact resistance in the areas immediately underneath the contact fingers 121 and the cross member 123, current injection into the SSL device 300 may be manipulated such that the SSL device 300 may have a balanced (e.g., uniform) current density profile in a lateral direction in the SSL device 300.

In certain embodiments, instead of increasing the contact resistance of areas underneath the contact fingers 121, the contact resistance of other areas may be modulated by incorporating a contact material 118 having portions with different contact resistance. For example, as shown in FIG. 7B, the contact material 118 may be placed in areas laterally spaced apart from the contact fingers 121. The contact materials 118 can have a lower contact resistance than the conductive material 125. As a result, the areas corresponding to the contact material 118 can have a lower electrical resistance than areas underneath the contact fingers 121. In the illustrated embodiment, the contact material 118 has first, second, and third portions 118*a*, 118*b*, and 118*c*. The first portion 118*a* has an contact resistance lower than the second and third portions 118*b*. In other embodiments, the contact material 118 can include other suitable number of portions. In further embodiments, the SSL device 300 may include both the contact material 118 and the insulative material 114, as shown in FIG. 7C.

Figure 8A:
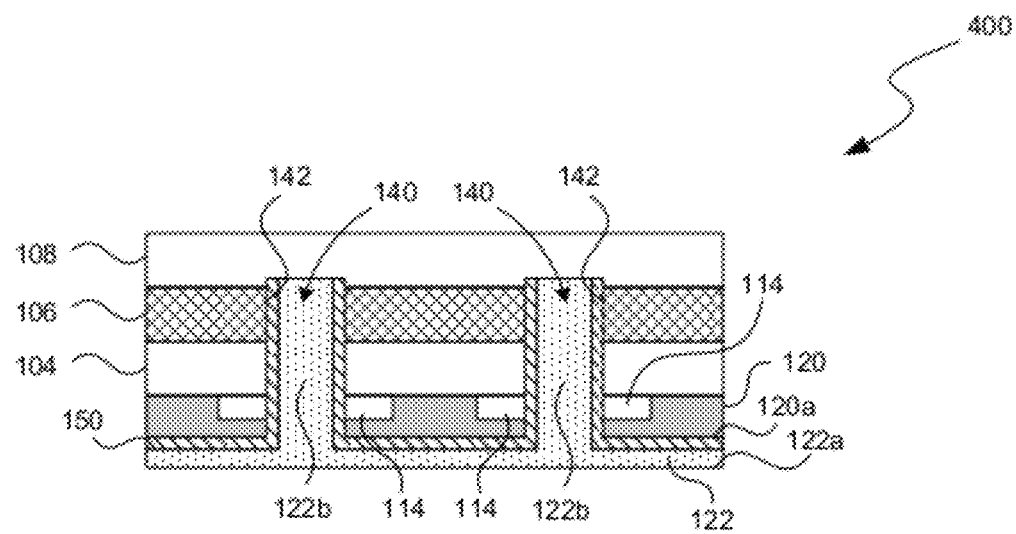
FIGS. 8A and 8B are cross-sectional views of a further SSL device in accordance with embodiments of the technology.
Figure 8B:
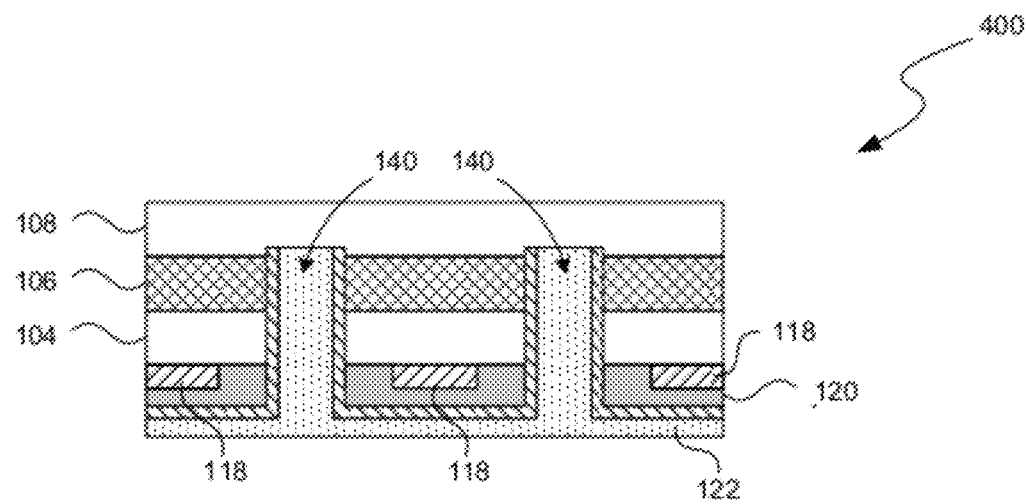

FIGS. 8A and 8B are cross-sectional views of an SSL device 400 in accordance with further embodiments of the technology. As shown in FIG. 8A, the SSL device 400 can include a plurality of openings 140 extending from a surface 120*a* of the first contact 120 toward the second semiconductor material 108. The SSL device 400 also includes an isolation material 150 on the surface 120*a* of the first contact 120 and the side walls 142 of the openings 140. The second contact 122 includes a first portion 122*a* on the isolation material 150 and second portions 122*b* in the openings 140.

As shown in FIG. 8A, the SSL device 400 can further include a plurality of pads of insulative material 114 generally straddling the individual openings 140. The pads of insulative material 114 can help to locally modulate the current density as described above with reference to FIGS. 3A-3D. Even though only one insulative portion is shown for each of the pads of insulative material 114, in certain embodiments the pads of insulative material 114 can individually include a plurality of insulative portions as described above with reference to FIG. 7A. FIG. 8B shows another embodiment of the SSL device 400 in which a plurality of pads of contact material 118 are placed in areas spaced apart from the openings 140. The pads of contact material 118 can also help to provide a generally uniform current density profile in the SSL device 400 as discussed above with reference to FIG. 7B.

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. As such, many of the foregoing embodiments have contacts with first and second materials that have different electrical conductivities. The contacts are configured to form preferential current paths or defined current flow paths through the first and second semiconductor materials to at least mitigate non-uniformities in current densities across an SSL. Accordingly, the disclosure is not limited except as by the appended claims.

I claim:

1. A solid state lighting ("SSL") device comprising:
   a first semiconductor material;
   a second semiconductor material spaced apart from the first semiconductor material;
   an active region between the first and second semiconductor materials;
   a contact on the first or second semiconductor material, wherein the contact includes—
      a first material having a first contact resistance, wherein the first material includes an insulative material on the first semiconductor material, the insulative material having a plurality of openings extending between the first semiconductor material and a surface of the insulative material, at least one of the plurality of openings having a different shape or size from the other openings; and
      a second material having a second contact resistance different than the first contact resistance, wherein the second material includes a conductive material on the insulative material, the conductive material having a first portion on the surface of the insulative material and a second portion in the openings of the insulative material; and
   wherein at least one of a shape, a size, a profile, and a distribution of the first and second materials varies from one region of the SSL device to another region of the SSL device.

2. An SSL device comprising:
   a first semiconductor material;
   a second semiconductor material spaced apart from the first semiconductor material;
   an active region between the first and second semiconductor materials;
   a first contact on the first semiconductor material;
   a second contact on the second semiconductor material wherein the second contact is laterally spaced apart from the first contact;
   wherein the first contact includes a first material having a first contact resistance and a second material having a second contact resistance, the first contact resistance being different from the second contact resistance;

wherein at least one of a shape, a size, a profile, and a distribution of the first and second materials varies from one region of the SSL device to another region of the SSL device;

the first material includes an insulative material on the first semiconductor material, the insulative material having a plurality of openings extending between the first semiconductor material and a surface of the insulative material, at least one of the plurality of openings having a different shape or size from the other openings; and the second material includes a conductive material on the insulative material, the conductive material having a first portion on the surface of the insulative material and a second portion in the openings of the insulative material.

3. An SSL device comprising:

a first semiconductor material;

a second semiconductor material spaced apart from the first semiconductor material;

an active region between the first and second semiconductor materials;

a first contact on the first semiconductor material;

a second contact on the second semiconductor material wherein the second contact is laterally spaced apart from the first contact;

wherein the first contact includes a first material having a first contact resistance and a second material having a second contact resistance, the first contact resistance being different from the second contact resistance;

wherein at least one of a shape, a size, a profile, and a distribution of the first and second materials varies from one region of the SSL device to another region of the SSL device;

the first material includes an insulative material on the first semiconductor material, the insulative material having a plurality of openings extending between the first semiconductor material and a surface of the insulative material, at least one of the plurality of openings having a different shape or size from the other openings;

the second material includes a conductive material on the insulative material, the conductive material having a first portion on the surface of the insulative material and a second portion in the openings of the insulative material;

wherein the insulative material includes—
a first region including a first number of openings; and
a second region spaced apart from the first region, wherein the second region includes a second number of openings different than the first number of openings.

4. The SSL device of claim 1 wherein:

the first material includes the insulative material on the first semiconductor material,
wherein the insulative material includes—
a first region including a first number of openings; and
a second region spaced apart from the first region, wherein the second region includes a second number of openings different than the first number of openings.

* * * * *